United States Patent
Hsu et al.

(10) Patent No.: US 10,157,828 B2
(45) Date of Patent: Dec. 18, 2018

(54) CHIP PACKAGE STRUCTURE WITH CONDUCTIVE PILLAR AND A MANUFACTURING METHOD THEREOF

(71) Applicant: Powertech Technology Inc., Hsinchu County (TW)

(72) Inventors: Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/599,477

(22) Filed: May 19, 2017

(65) Prior Publication Data

US 2018/0076131 A1   Mar. 15, 2018

Related U.S. Application Data (60) Provisional application No. 62/385,257, filed on Sep. 9, 2016.

(51) Int. Cl.
*H01L 23/522* (2006.01)
*H01L 23/31* (2006.01)
(Continued)

(52) U.S. Cl.
CPC .......... *H01L 23/5226* (2013.01); *H01L 21/56* (2013.01); *H01L 23/3107* (2013.01);
(Continued)

(58) Field of Classification Search
CPC . H01L 23/5226; H01L 23/3107; H01L 24/14; H01L 25/04; H01L 21/56;
(Continued)

(56) References Cited

U.S. PATENT DOCUMENTS 6,633,086 B1   10/2003   Peng et al.
8,531,032 B2 *   9/2013   Yu ........................ H01L 23/3114
257/738

(Continued)

FOREIGN PATENT DOCUMENTS

TW   201308568   2/2013

OTHER PUBLICATIONS

"Office Action of Taiwan Counterpart Application", dated Jul. 10, 2018, p. 1-p. 5.
(Continued)

*Primary Examiner* — Alexander Oscar Williams
(74) *Attorney, Agent, or Firm* — JCIPRNET (57) ABSTRACT

A chip package structure includes a semiconductor component, a plurality of conductive pillars, an encapsulant and a redistribution layer. The semiconductor component includes a plurality of pads. The conductive pillars are disposed on the pads, wherein each of the conductive pillars is a solid cylinder including a top surface and a bottom surface, and a diameter of the top surface is substantially the same as a diameter of the bottom surface. The encapsulant encapsulates the semiconductor component and the conductive pillars, wherein the encapsulant exposes the top surface of each of the conductive pillars. The redistribution layer is disposed on the encapsulant and electrically connected to the conductive pillars.

14 Claims, 11 Drawing Sheets

(51) Int. Cl.
*H01L 23/00* (2006.01)
*H01L 25/04* (2014.01)
*H01L 21/56* (2006.01)
*H01L 25/00* (2006.01)

(52) U.S. Cl.
CPC .............. *H01L 24/11* (2013.01); *H01L 24/14* (2013.01); *H01L 24/27* (2013.01); *H01L 24/32* (2013.01); *H01L 25/04* (2013.01); *H01L 25/50* (2013.01); *H01L 2224/32145* (2013.01)

(58) Field of Classification Search
CPC ......... H01L 25/50; H01L 24/11; H01L 24/27; H01L 24/32; H01L 2224/32145
USPC ....... 257/737, 738, 734, 778, 774, 773, 686, 257/777, 685
See application file for complete search history.

(56) References Cited

U.S. PATENT DOCUMENTS

| | | | |
|---|---|---|---|
| 9,263,394 | B2 | 2/2016 | Uzoh et al. |
| 2012/0049364 | A1 | 3/2012 | Sutardja et al. |
| 2012/0139068 | A1 | 6/2012 | Stacey |
| 2014/0076617 | A1 | 3/2014 | Chen et al. |
| 2017/0301649 | A1* | 10/2017 | Wu ...................... H01L 25/0652 |
| 2017/0345761 | A1* | 11/2017 | Yu ........................ H01L 21/4853 |
| 2017/0345764 | A1* | 11/2017 | Chang ................. H01L 23/5389 |
| 2017/0373004 | A1* | 12/2017 | Yu ........................... H01L 28/40 |

OTHER PUBLICATIONS

"Office Action of Taiwan Counterpart Application", dated Aug. 30, 2018, p. 1-p. 7.

* cited by examiner

CHIP PACKAGE STRUCTURE WITH CONDUCTIVE PILLAR AND A MANUFACTURING METHOD THEREOF

CROSS REFERENCE TO RELATED APPLICATION

This application claims the priority benefit of U.S. provisional application Ser. No. 62/385,257, filed on Sep. 9, 2016. The entirety of the above-mentioned patent application is hereby incorporated by reference herein and made a part of specification.

BACKGROUND OF THE INVENTION

Field of the Invention

The present invention generally relates to chip package structure and a manufacturing method thereof. More particularly, the present invention relates to a stacked type chip package structure and a manufacturing method thereof.

Description of Related Art

Recently, attention has paid to a semiconductor device called a "substrate with a built-in chip" in which a chip and the like are buried in a substrate made of resin and the like and a semiconductor device in which an insulating layer and a wiring layer are formed on the chip. In semiconductor devices such as a substrate with a built-in chip, it is necessary to bury a chip in the insulating layer, and further form a via hole through the insulating layer to electrically connect an electrode pad on the chip to an external electric terminal.

In general, the via hole is typically formed by using a laser beam. In this case, the laser beam passes through the insulating layer, and the electrode pad of the chip made of Al and the like may be flied apart by irradiation of the laser beam. As a result, the device including a semiconductor chip is disadvantageously damaged.

SUMMARY OF THE INVENTION

Accordingly, the present invention is directed to a chip package structure, which has favourable reliability, lower production cost and thinner overall thickness.

The present invention is further directed to a manufacturing method of the chip package structure, which improves reliability and yield of the stacked type chip package structure and reduces production cost and overall thickness of the stacked type chip package structure.

The present invention provides a chip package structure includes a first semiconductor component, a plurality of first conductive pillars, a first encapsulant and a first redistribution layer. The first semiconductor component includes a plurality of first pads. The first conductive pillars are disposed on the first pads, wherein each of the first conductive pillars is a solid cylinder including a top surface and a bottom surface, and a diameter of the top surface is substantially the same as a diameter of the bottom surface. The first encapsulant encapsulates the first semiconductor component and the first conductive pillars, wherein the first encapsulant exposes the top surface of each of the first conductive pillars. The first redistribution layer is disposed on the first encapsulant and electrically connected to the first conductive pillars.

The present invention provides a manufacturing method of a chip package structure, and the method includes the following steps. A first semiconductor component is disposed on a first carrier, wherein the first semiconductor component includes a first active surface and a plurality of first pads disposed on the first active surface. A plurality of first conductive pillars are formed on the first pads, wherein each of the first conductive pillars is a solid cylinder including a top surface and a bottom surface, and a diameter of the top surface is substantially the same as a diameter of the bottom surface. A first encapsulant is formed to encapsulate the first semiconductor component and the first conductive pillars, wherein the first encapsulant exposes the top surface of each of the first conductive pillars. A first redistribution layer is formed on the first encapsulant, wherein the first redistribution layer is electrically connected to the first conductive pillars. The first carrier is removed.

In light of the foregoing, in the present invention, at least one semiconductor component is disposed on the first carrier, and the conductive pillars are formed on the semiconductor component. Then, the encapsulant is formed to encapsulate the semiconductor component and expose the top surface of the conductive pillars, and the redistribution layer is formed on the encapsulant to electrically connect the semiconductor component. Then, multiple semiconductor component are sequentially stacked on the redistribution layer, and the steps of forming conductive pillars/through pillars, encapsulant and redistribution layer may be repeated to form the stacked type chip package structure. Accordingly, the thickness of the chip package structure may be further reduced, and the process of forming conductive vias for the semiconductor component by laser drilling may be omitted, so as to reduce the production cost of the chip package structure. Also, the damage to the pads of the semiconductor component caused by laser may be avoided since the laser drilling process is omitted herein. In addition, the conductive pillars of the invention are solid cylinders pre-formed on the semiconductor component, while the via formed by laser process is in a taper shape with voids inside. Therefore, the conductive pillars may have better electrical performance, and the gap between any two adjacent conductive pillars may be reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
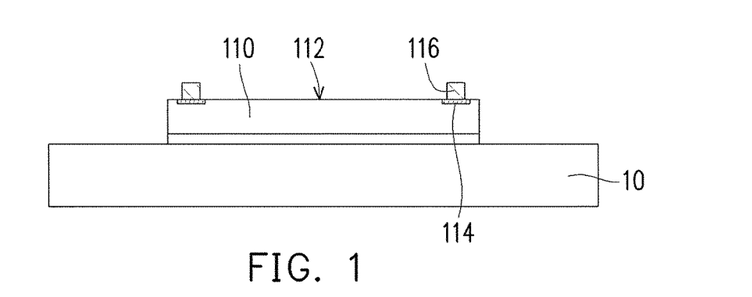
FIG. 1 to FIG. 7 illustrate cross-sectional views of a manufacturing process of a chip package structure according to an embodiment of the invention.

FIG. 1 to FIG. 7 illustrate cross-sectional views of a manufacturing process of a chip package structure according to an embodiment of the invention. In the present embodiment, a manufacturing process of a chip package structure may include the following steps. Referring to FIG. 1, a first semiconductor component 110 is disposed on a first carrier 10 as shown in FIG. 1. The first semiconductor component 110 may be a chip. The first semiconductor component 110 may include a first active surface 112 and a plurality of first pads 114 disposed on the first active surface 112. Then, a plurality of first conductive pillars 116 are formed on the first pads 114. Each of the first conductive pillars 116 is a solid pillar. A first conductive pillar 116 may include a top surface and a bottom surface parallel and opposite to the top surface. A dimension of the top surface of each first conductive pillar 116 is substantially the same as a dimension of the bottom surface of each first conductive pillar 116 as shown in FIG. 1. Each first conductive pillar 116 may have a uniform dimension from top to bottom. In one embodiment, each of the first conductive pillars 116 is a solid cylinder. A diameter of the top surface of each first conductive pillar 116 is substantially the same as a diameter of the bottom surface of each first conductive pillar 116. Each first conductive pillar 116 may have a uniform diameter from top to bottom. In the present embodiment, the first conductive pillars 116 may be formed by electroplating process, but the invention is not limited thereto.

Figure 2:
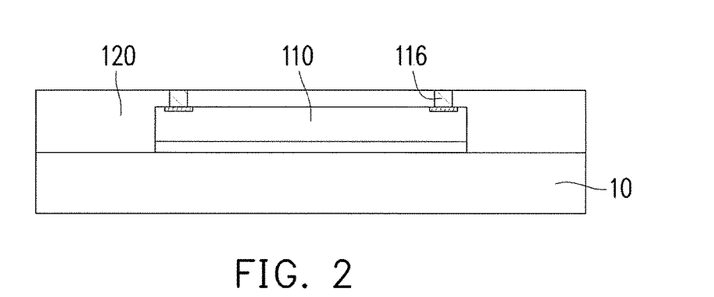

Referring to FIG. 2, a first encapsulant 120 is formed to encapsulate the first semiconductor component 110 and the first conductive pillars 116. The first encapsulant 120 exposes the top surface of each first conductive pillar 116. In the present embodiment, the first encapsulant 120 may completely cover the first semiconductor component 110 and the first conductive pillars 116. Then, a grinding process may be performed on the first encapsulant 120 until the top surface of each first conductive pillar 116 is exposed. As such, a top surface of the first encapsulant 120 is coplanar with the top surface of each first conductive pillar 116 as shown in FIG. 2. With such configuration, the thickness of the chip package structure may be further reduced. Moreover, the process of forming conductive vias for the first semiconductor component 110 by laser drilling may be omitted. Accordingly, the production cost of the chip package structure may be reduced. Also, the damage to the first pads 114 caused by laser may be avoided since the laser drilling process is omitted herein. In addition, the pre-made conductive pillar 116 is solid cylinders while the via formed by laser process is in a taper shape with voids inside. Therefore, the conductive pillar 116 may have better electrical performance, and the gap between any two adjacent conductive pillars 116 may be reduced.

Figure 3:
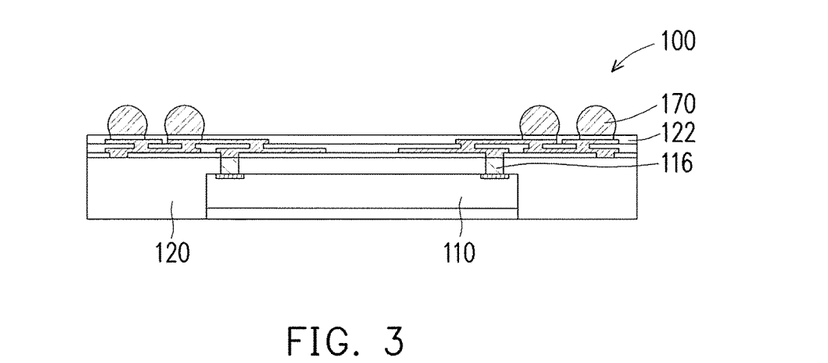
Figure 4:
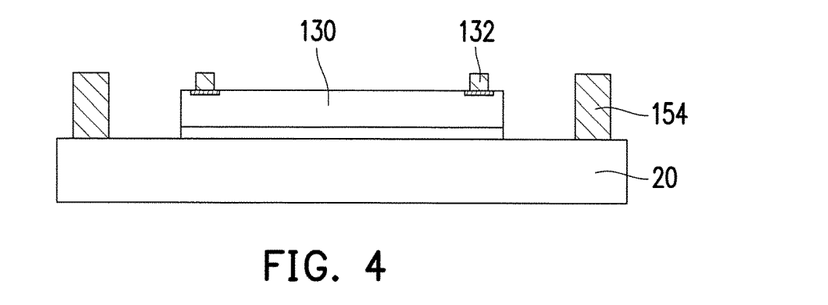

Then, referring to FIG. 3, a first redistribution layer 122 is formed on the first encapsulant 120 as shown in FIG. 2 and the first carrier 10 may be removed. The first redistribution layer 122 is electrically connected to the first semiconductor component 110 through the first conductive pillars 116. Also, a plurality of solder balls 170 may be formed on the first redistribution layer 122 and electrically connected to the first redistribution layer 122, such that the chip package structure 100 may be electrically connected to an external device through the solder balls 170. At the time, the manufacturing process of the chip package structure 100 may be substantially done.

In one embodiment, a sub chip package 180 may be disposed on the first solder balls 170 of the chip package structure 100, and electrically connected to the first solder balls 170. For example, the method of forming the sub chip package 180 may include the following steps. Firstly, referring to FIG. 4, a second semiconductor component 130 is disposed on a second carrier 20. In the present embodiment, the second semiconductor component 130 may include a second active surface and a plurality of second pads disposed on the second active surface. Then, a plurality of second conductive pillars 132 are formed on the second pads of the second semiconductor component 130. In the present embodiment, each second conductive pillar 132 is a solid pillar. A dimension of the top surface of each second conductive pillar 132 is substantially the same as the dimension of the bottom surface of each second conductive pillar 132. In one embodiment, each of the second conductive pillar 132 is a solid cylinder. A diameter of the top surface of each second conductive pillar 132 is substantially the same as a diameter of the bottom surface of each second conductive pillar 132. In the present embodiment, the second conductive pillar 132 is similar to the first conductive pillars 116 except the length of each second conductive pillar 132 may be shorter than each first conductive pillars 116. Then, a plurality of through pillars 154 are formed on the second carrier 20. In the present embodiment, the through pillars 154 surround the second semiconductor component 130.

Figure 5:
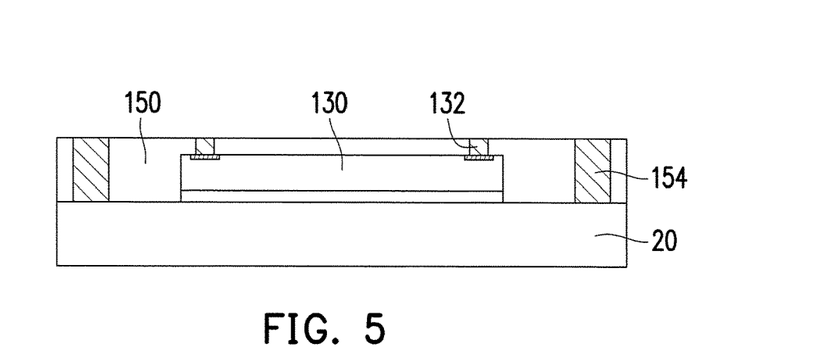

Then, referring to FIG. 5, a second encapsulant 150 is formed to encapsulate the second semiconductor component 130, the second conductive pillars 132 and the through pillars 154. In the present embodiment, the second encapsulant 150 exposes the upper surface of each second conductive pillar 132 and the upper surface of each through pillar 154. Similarly, the second encapsulant 150 may completely cover the second semiconductor component 130, the second conductive pillars 132 and the through pillars 154. Then, a grinding process may be performed on the second encapsulant 150 until the upper surfaces of the second conductive pillars 132 and the through pillar 154 are exposed, so as to be electrically connected to a second redistribution layer 152 subsequently formed.

Figure 6:
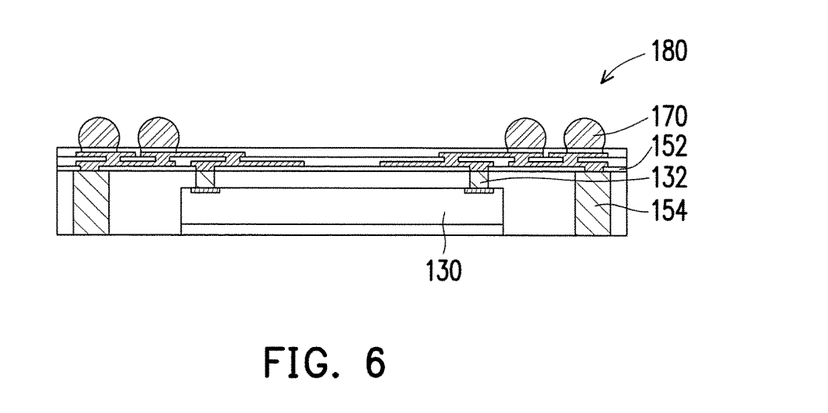

Then, referring to FIG. 6, a second redistribution layer 152 is formed on the second encapsulant 150 and electrically connected to the second conductive pillars 132 and the through pillars 154. Also, a plurality of solder balls 170 may be formed on the second redistribution layer 152 and the second carrier 20 may be removed. At the time, the manufacturing process of the sub chip package 180 may be substantially done.

Figure 7:
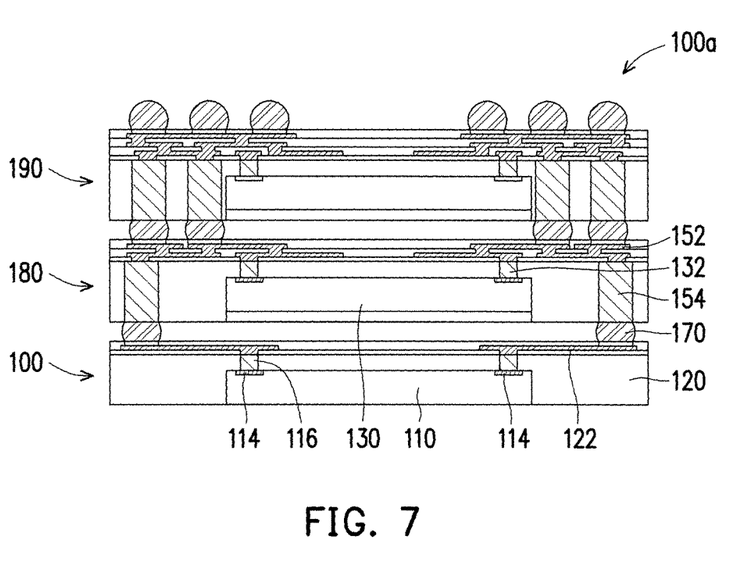

Then, referring to FIG. 7, the sub chip package 180 may be mounted on the chip package structure 100 shown in FIG. 3 through the solder balls 170. In the present embodiment, similar process illustrated in FIG. 4 to FIG. 6 may be repeated to form another sub chip package 190 and then the sub chip package 190 may be mounted on the sub chip package 180 to form the chip package structure 100a shown in FIG. 7. It is noted that the present embodiment is merely for illustration. The number and the formation of the sub chip package are not limited in the present invention.

Figure 8:
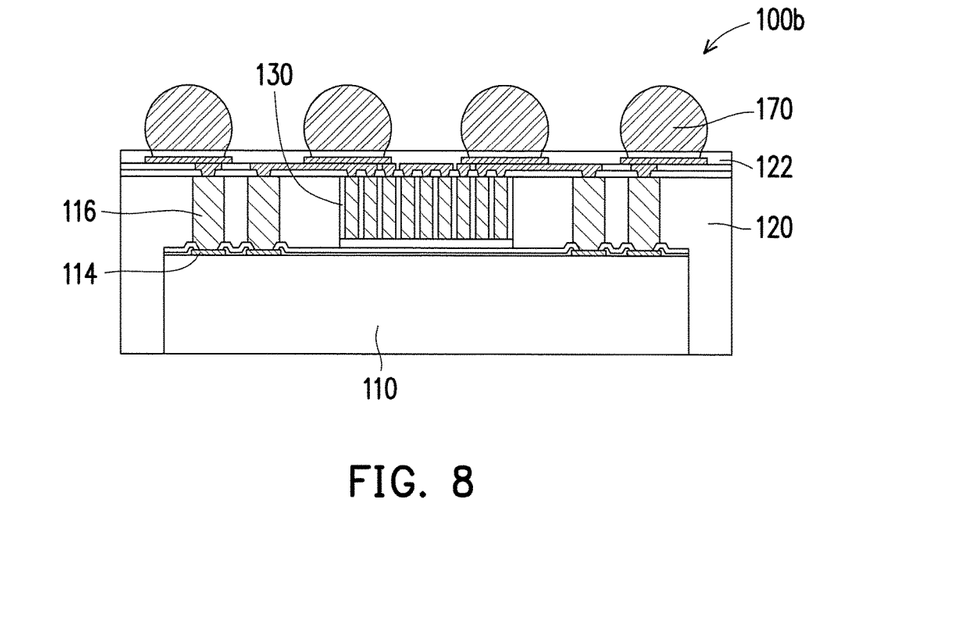
FIG. 8 illustrates a cross-sectional view of a chip package structure according to an embodiment of the invention.

FIG. 8 illustrates a cross-sectional view of a chip package structure according to an embodiment of the invention. It is noted that the chip package structure 100b as shown in FIG. 8 contains many features same as or similar to the chip package structure 100 disclosed earlier with FIG. 3. For brevity, detailed description of same or similar features may be omitted, and the same or similar reference numbers denote the same or like components.

Referring to FIG. 8, in the present embodiment, before the first encapsulant 120 is formed, i.e. before the step illustrated in FIG. 2, a second semiconductor component 130 is disposed on the first active surface 112 of the first semiconductor component 110. Then, the first encapsulant 120 encapsulates first semiconductor component 110 and the second semiconductor component 130, and the second semiconductor component 130 is configured to be electrically connected to the first redistribution layer 122. In the present embodiment, the second semiconductor component 130 may be an interposer having a plurality of through pillars as it is illustrated in FIG. 8, and the first redistribution layer 122 is electrically connected to the second semiconductor component 130.

Figure 9:
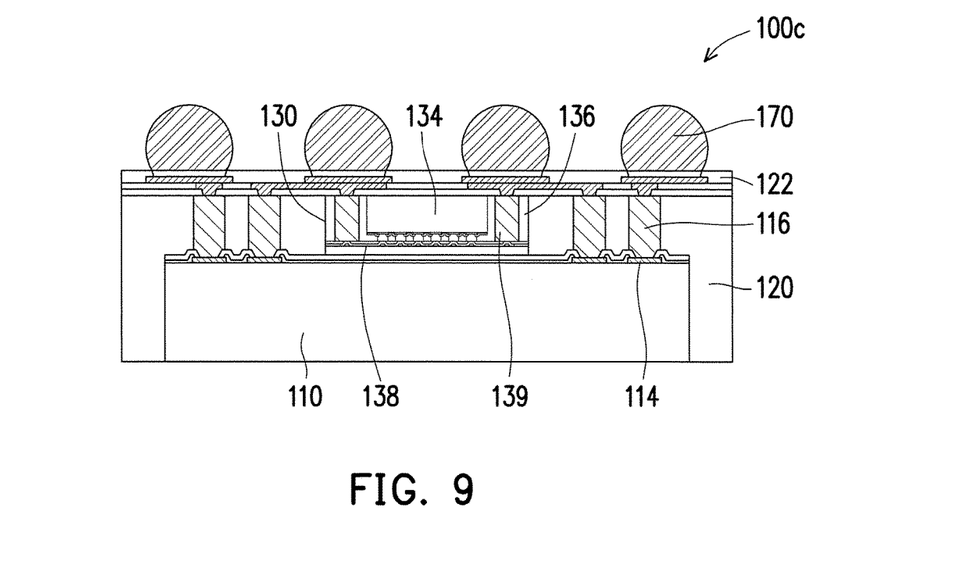
FIG. 9 illustrates a cross-sectional view of a chip package structure according to an embodiment of the invention.

FIG. 9 illustrates a cross-sectional view of a chip package structure according to an embodiment of the invention. It is noted that the chip package structure 100c as shown in FIG. 9 contains many features same as or similar to the chip package structure 100 disclosed earlier with FIG. 3. For purpose of clarity and simplicity, detail description of same or similar features may be omitted, and the same or similar reference numbers denote the same or like components.

Referring to FIG. 9, in the present embodiment, the second semiconductor component 130 may be a chip package including a chip 134, a molding material 136, a plurality of through pillars 139 and a redistribution circuit 138. The pads of the chip 134 faces the first semiconductor component 110, and the molding material 136 encapsulates the chip 134. The redistribution circuit 138 is disposed on the molding material 136 and disposed between the first active surface 112 and the molding material 136. The redistribution circuit 138 is electrically connected to the chip 134, and the through pillars 139 penetrate the molding material 136 to electrically connect the first redistribution layer 122 and the redistribution circuit 138.

FIG. 10 to FIG. 13 illustrate cross-sectional views of a manufacturing process of a chip package structure according to an embodiment of the invention. It is noted that the manufacturing process of the chip package structure 100d as shown in FIG. 10 to FIG. 13 contains many features same as or similar to the manufacturing process of the chip package structure 100 disclosed earlier with FIG. 1 to FIG. 3. For purpose of clarity and simplicity, detail description of same or similar features may be omitted, and the same or similar reference numbers denote the same or like components.

Figure 10:
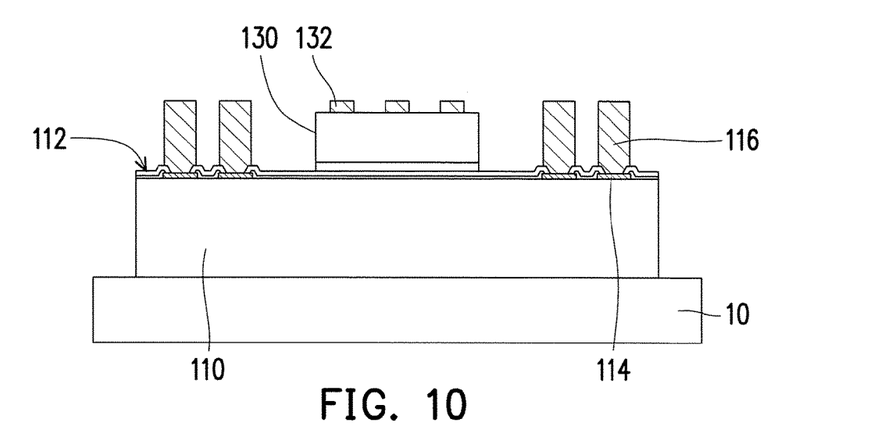
FIG. 10 to FIG. 13 illustrate cross-sectional views of a manufacturing process of a chip package structure according to an embodiment of the invention.

Referring to FIG. 10, in the present embodiment, before the first encapsulant 120 is formed, i.e. before the step illustrated in FIG. 2, a second semiconductor component 130 is disposed on the first active surface 112 of the first semiconductor component 110. Then, a plurality of second conductive pillars 132 are formed on the pads of the second semiconductor component 130. Each second conductive pillar 132 is a solid pillar similar to the first conductive pillar 116.

Figure 11:
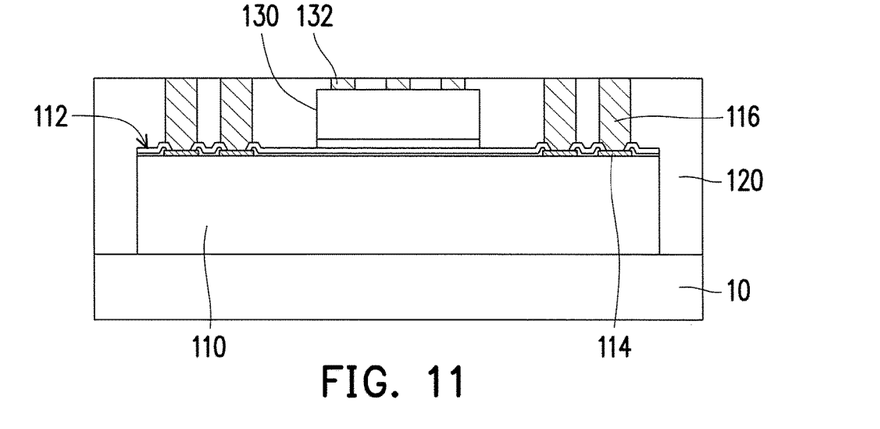

Then, referring to FIG. 11, the first encapsulant 120 encapsulates the first semiconductor component 110, the second semiconductor component 130, the first conductive pillars 116 and the second conductive pillars 132, and the first encapsulant 120 exposes the upper surfaces of the first conductive pillars 116 and the second conductive pillars 132, such that the first conductive pillars 116 and the second conductive pillars 132 are electrically connected to the first redistribution layer 122 subsequently formed. In the present embodiment, the first encapsulant 120 may completely cover the first semiconductor component 110, the second semiconductor component 130, the first conductive pillars 116 and the second conductive pillars 132. Then, a grinding process may be performed on the first encapsulant 120 until the top surfaces of the first conductive pillars 116 and the second conductive pillars 132 are exposed. As such, a top surface of the first encapsulant 120 is coplanar with the top surfaces of the first conductive pillars 116 and the second conductive pillars 132 as shown in FIG. 11.

With such configuration, the thickness of the chip package structure may be further reduced. Moreover, the process of forming conductive vias for the semiconductor components 110, 130 by laser drilling may be omitted. Accordingly, the production cost of the chip package structure may be reduced. Also, the damage to the pads of semiconductor components 110, 130 caused by laser may be avoided since the laser drilling process is omitted herein. In addition, the pre-made conductive pillars 116, 132 is solid cylinders while the via formed by laser process is in a taper shape with voids inside. Therefore, the conductive pillars 116, 132 may have better electrical performance, and the gap between any two adjacent conductive pillars 116, 132 may be reduced.

Figure 12:
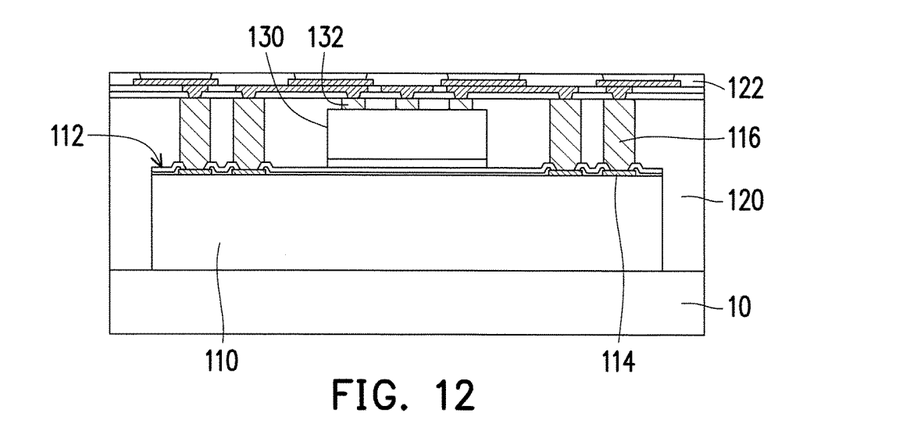
Figure 13:
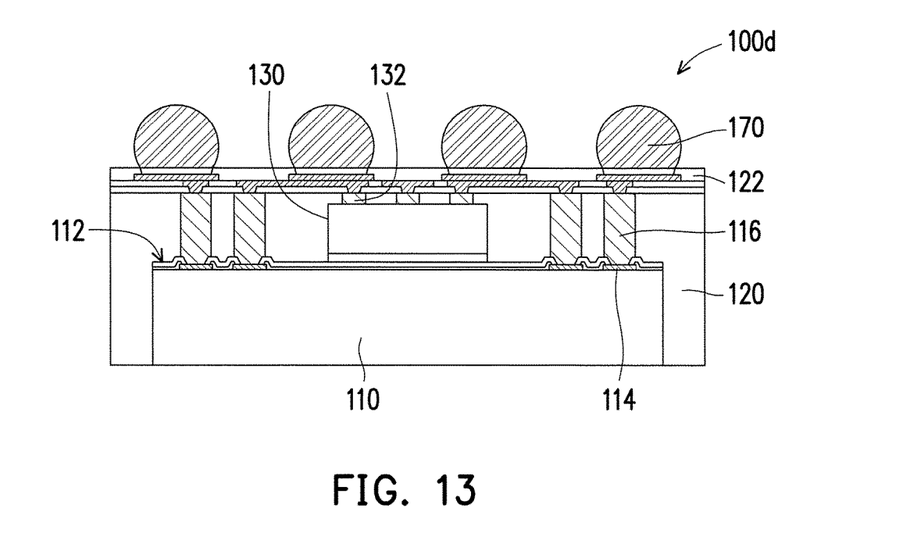

Then, referring to FIG. 12, the first redistribution layer 122 is formed on the first encapsulant 120 as shown in FIG. 12 and the first carrier 10 may be removed. The first redistribution layer 122 is electrically connected to the first semiconductor component 110 and the second semiconductor component 130 through the first conductive pillars 116 and the second conductive pillars 132. Also, referring to FIG. 13, a plurality of solder balls 170 may be formed on the first redistribution layer 122 and electrically connected to the first redistribution layer 122, such that the chip package structure 100d may be electrically connected to an external device through the solder balls 170. At the time, the manufacturing process of the chip package structure 100d may be substantially done.

Figure 14:
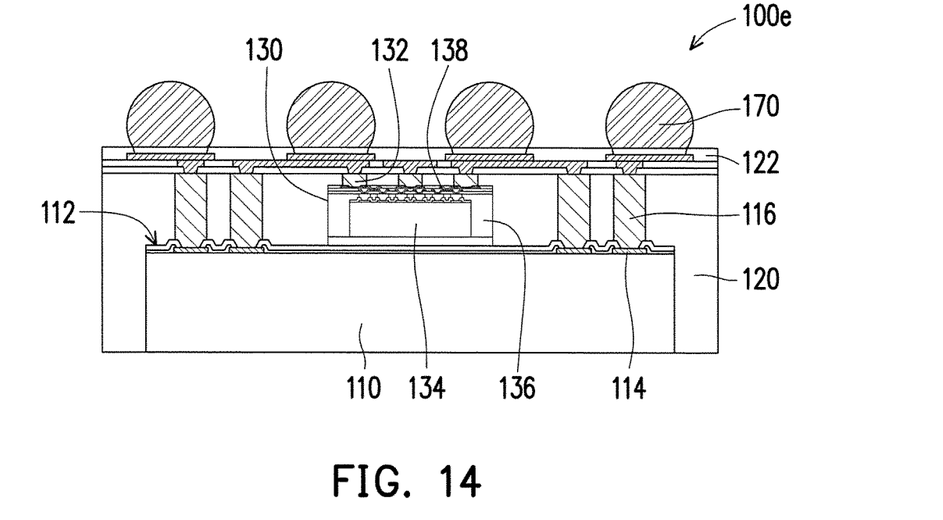
FIG. 14 illustrates a cross-sectional view of a chip package structure according to an embodiment of the invention.

FIG. 14 illustrates a cross-sectional view of a chip package structure according to an embodiment of the invention. It is noted that the chip package structure 100e as shown in FIG. 14 contains many features same as or similar to the chip package structure 100d disclosed earlier with FIG. 13. For purpose of clarity and simplicity, detail description of same or similar features may be omitted, and the same or similar reference numbers denote the same or like components.

In the present embodiment, the second semiconductor component 130 may include a chip 134, a molding material 136 and a redistribution circuit 138. The pads of the chip 134 faces away from the first semiconductor component 110, and the molding material 136 encapsulates the chip 134. The redistribution circuit 138 is formed on the molding material 136 and electrically connected to the chip 134 and the second conductive pillars 132.

Figure 15:
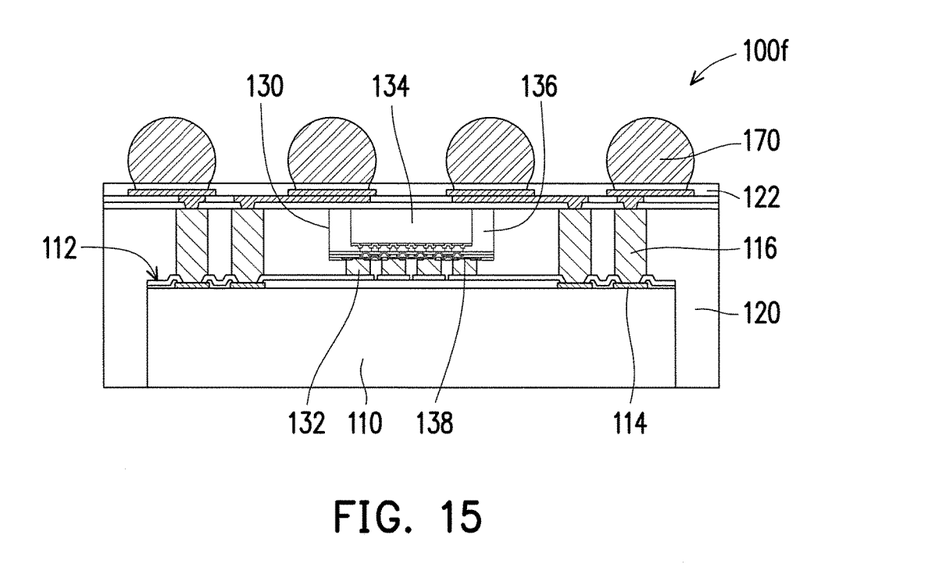
FIG. 15 illustrates a cross-sectional view of a chip package structure according to an embodiment of the invention.

FIG. 15 illustrates a cross-sectional view of a chip package structure according to an embodiment of the invention. It is noted that the chip package structure 100f as shown in FIG. 15 contains many features same as or similar to the chip package structure 100e disclosed earlier with FIG. 14. For purpose of clarity and simplicity, detail description of same or similar features may be omitted, and the same or similar reference numbers denote the same or like components.

Referring to FIG. 15, in the present embodiment, the second conductive pillars 132 are formed on the second semiconductor component 130 and connect between the first active surface 112 of the first semiconductor component 110 and the second semiconductor component 130, such that the second semiconductor component 130 is electrically connected to the first semiconductor component 110 through the second conductive pillars 132. In the present embodiment, the second semiconductor component 130 includes a chip 134, a molding material 136 and a redistribution circuit 138. The pads of the chip 134 faces the first semiconductor component 110, and the molding material 136 encapsulates the chip 134. The redistribution circuit 138 is formed on the molding material 136, so that the redistribution circuit 138 is disposed between the first active surface 112 of the first semiconductor component 110 and the molding material 136. The redistribution circuit 138 is configured to be electrically connected to the chip 134 and the first semiconductor component 110.

A plurality of second conductive pillars 132 is formed on the second semiconductor component 130 before the first encapsulant 120 is formed. In the present embodiment, the second conductive pillars 132 may be firstly formed on the second semiconductor component 130 to be electrically connected to the redistribution circuit 138. Then, the second semiconductor component 130 and the second conductive pillars 132 are mounted on the first active surface 112 of the first semiconductor component 110, but the invention is not limited thereto. In the present embodiment, each of the second conductive pillars 132 is a solid pillar similar to the first conductive pillars 116, and the second conductive pillars 132 are encapsulated by the first encapsulant 120 and connect between the first active surface 112 and the second semiconductor component 130, such that the second semiconductor component 130 is electrically connected to the first semiconductor component 110 through the second conductive pillars 132.

FIG. 16 to FIG. 19 illustrate cross-sectional views of a part of a manufacturing process of a chip package structure according to an embodiment of the invention. It is noted that the manufacturing process of the chip package structure 100g as shown in FIG. 16 to FIG. 19 contains many features same as or similar to the manufacturing process of the chip package structure 100d disclosed earlier with FIG. 10 to FIG. 13. For purpose of clarity and simplicity, detail description of same or similar features may be omitted, and the same or similar reference numbers denote the same or like components.

Figure 16:
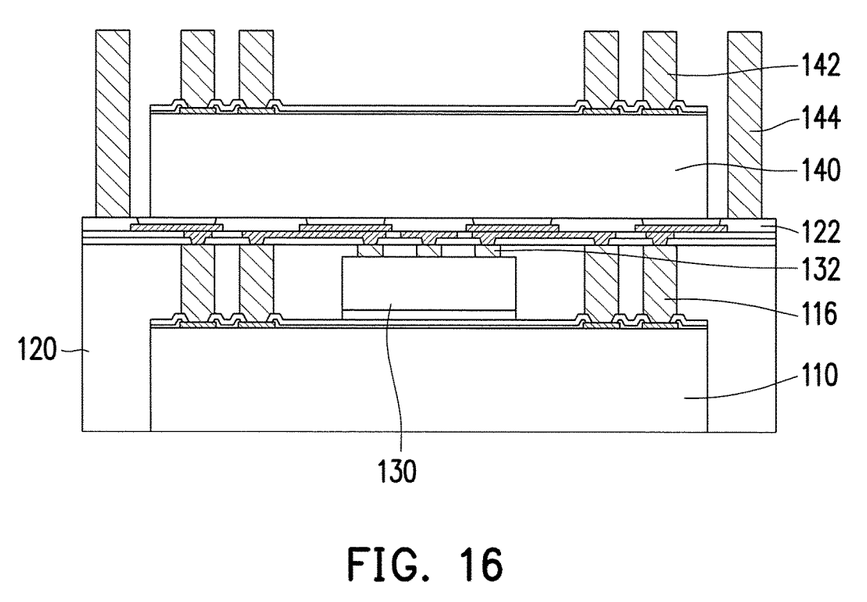
FIG. 16 to FIG. 19 illustrate cross-sectional views of a part of a manufacturing process of a chip package structure according to an embodiment of the invention.

In the present embodiment, the manufacturing process illustrated in FIG. 16 to FIG. 19 may be performed after the process illustrated in FIG. 12, i.e. after the first redistribution layer 122 is formed on the first encapsulant 120 and the first carrier 10 is removed. Referring to FIG. 16, a third semiconductor component 140 is disposed on the first redistribution layer 122. Then, a plurality of third conductive pillars 142 are formed on the pads of the third semiconductor component 140 to be electrically connected to the third semiconductor component 140. Each of the third conductive pillars 142 is a solid pillar similar to the first conductive pillars 116. Namely, the dimension of the upper surface of each third conductive pillar 142 is about the same as the dimension of the lower surface of each third conductive pillar 142. Next, a plurality of through pillars 144 are formed on the first redistribution layer 122. Each of the through pillars 144 is also a solid pillar similar to the first conductive pillars 116. Namely, the dimension of the upper surface of each through pillar 144 is about the same as the dimension of the lower surface of each through pillar 144.

Figure 17:
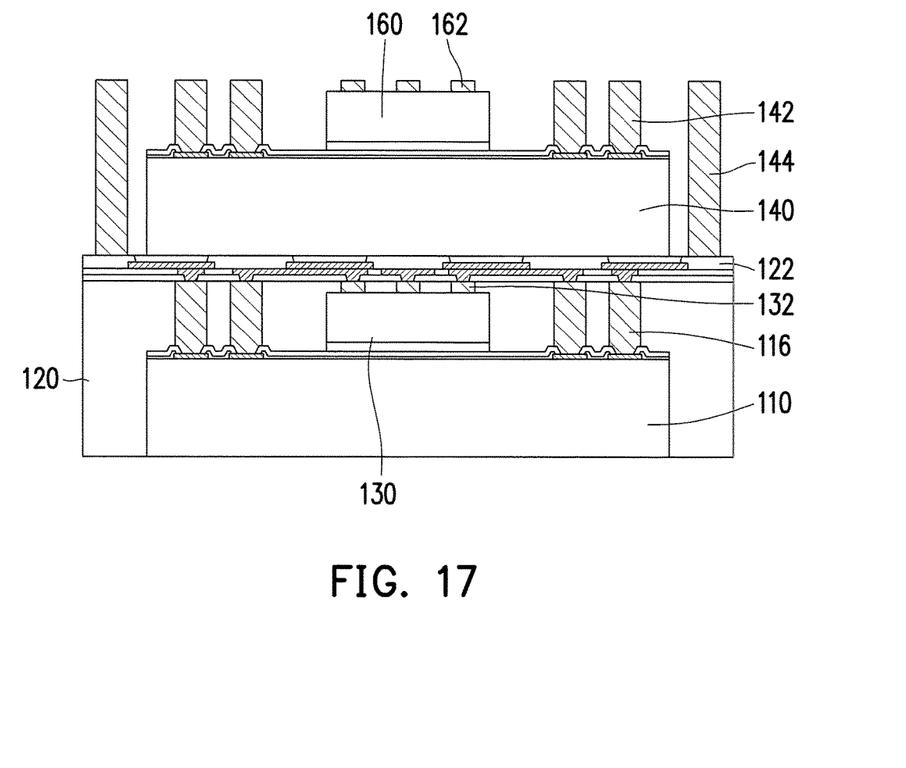

Referring to FIG. 17, a fourth semiconductor component 160 is disposed on the third semiconductor component 140. Then, a plurality of fourth conductive pillars 162 are formed on the pads of the fourth semiconductor component 160 to be electrically connected to the fourth semiconductor component 160. Each of the fourth conductive pillars 162 is a solid pillar. In the present embodiment, the dimension of the upper surface of each fourth conductive pillar 162 is about the same as the dimension of the lower surface of each fourth conductive pillar 162.

Figure 18:
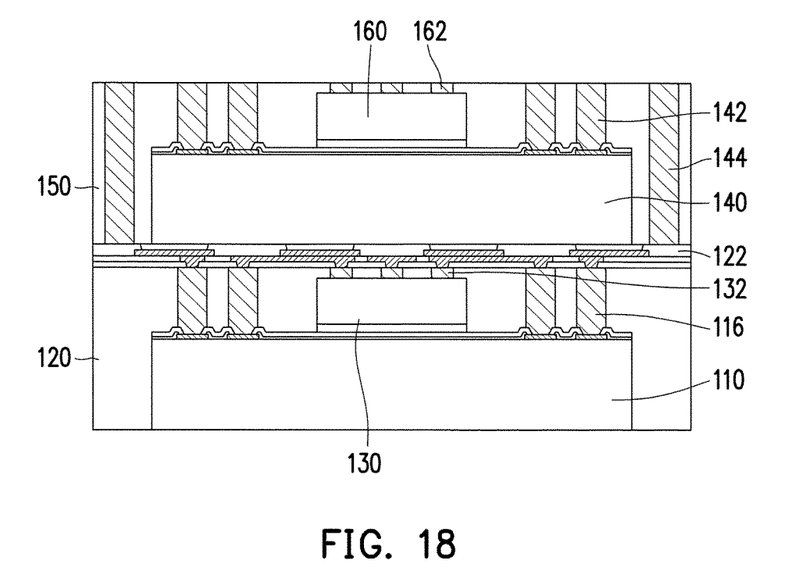

Then, referring to FIG. 18, the second encapsulant 150 is formed to encapsulate the third semiconductor component 140, the fourth semiconductor component 160, the third conductive pillars 142, the fourth conductive pillars 162 and the through pillars 144. The second encapsulant 150 exposes the upper surfaces of the third conductive pillars 142, the fourth conductive pillars 162 and the through pillars 144. In the present embodiment, the second encapsulant 150 may completely cover the upper surfaces of the third conductive pillars 142, the fourth conductive pillars 162 and the through pillars 144 first. Then, the grinding process is performed on the second encapsulant 150 until the upper surfaces of the third conductive pillars 142, the fourth conductive pillars 162 and the through pillars 144 is exposed. With such configuration, the thickness of the chip package structure may be further reduced. Moreover, the process of forming conductive vias for the semiconductor components 140, 160 may be omitted. Accordingly, the production cost of the chip package structure may be reduced. Then, a first redistribution layer 122 is formed on the first encapsulant 120 as shown in FIG. 2. The first redistribution layer 122 is electrically connected to the first semiconductor component 110 through the first conductive pillars 116. Also, the damage to the pads of the semiconductor components 140, 160 caused by laser may be avoided since the laser drilling process is omitted herein. In addition, the pre-made pillars 162, 142, 144 are solid cylinders while the via formed by laser process is in a taper shape with voids inside. Therefore, the pillars 162, 142, 144 may have better electrical performance, and the gap between any two adjacent pillars 162, 142, 144 may be reduced.

Figure 19:
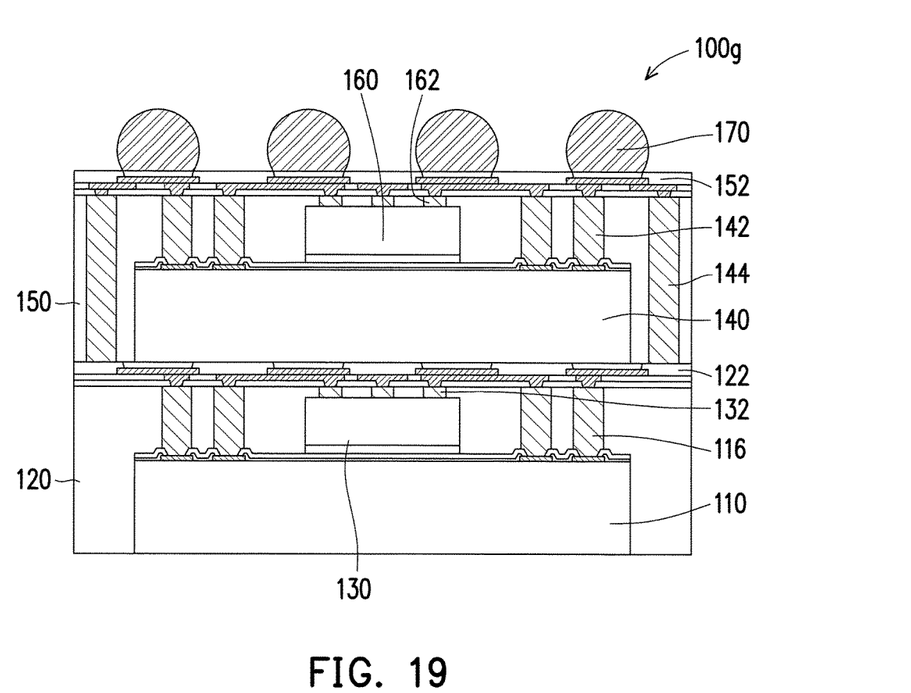

Next, referring to FIG. 19, a second redistribution layer 152 is formed on the second encapsulant 150 and the first carrier 10 is removed. The second redistribution layer 152 is electrically connected to the third conductive pillars 142, the through pillars 144 and the fourth conductive pillars 162. Also, a plurality of solder balls 170 may be formed on and electrically connected to the second redistribution layer 152, such that the chip package structure 100g may be electrically connected to an external device through the solder balls 170. At the time, the manufacturing process of the chip package structure 100g may be substantially done.

In sum, in the present invention, at least one semiconductor component is disposed on the carrier, and the conductive pillars are formed on the semiconductor component. Then, the encapsulant is formed to encapsulate the semiconductor component and expose the top surface of the conductive pillars, and the redistribution layer is formed on the encapsulant to electrically connect the semiconductor component. Then, multiple semiconductor component are sequentially stacked on the redistribution layer, and the steps of forming conductive pillars/through pillars, encapsulant and redistribution layer may be repeated to form the stacked type chip package structure.

With such configuration, the thickness of the chip package structure may be further reduced, and the process of forming conductive vias for the semiconductor component by laser drilling may be omitted, so as to reduce the production cost of the chip package structure. Also, the damage to the pads of the semiconductor component caused by laser may be avoided since the laser drilling process is omitted herein. In addition, the conductive pillars of the invention are solid cylinders pre-formed on the semiconductor component, while the via formed by laser process is in a taper shape with voids inside. Therefore, the conductive pillars may have better electrical performance, and the gap between any two adjacent conductive pillars may be reduced.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   only one first semiconductor component comprising a first active surface and a plurality of first pads disposed on the first active surface;
   a plurality of first conductive pillars disposed on the first pads, wherein each of the first conductive pillars is a solid pillar comprising a top surface and a bottom surface, and a dimension of the top surface is substantially the same as a dimension of the bottom surface;
   a first encapsulant encapsulating the first semiconductor component and the first conductive pillars, wherein the first encapsulant exposes the top surface of each of the first conductive pillars;
   a first redistribution layer disposed on the first encapsulant and electrically connected to the first conductive pillars; and
   a second semiconductor component disposed on the first active surface and electrically connected to the first redistribution layer, wherein the first encapsulant encapsulates the second semiconductor component, and the first semiconductor component has a surface area greater than a surface area of the second semiconductor component.

2. The chip package structure as claimed in claim 1, further comprising:
   a plurality of second conductive pillars disposed on the second semiconductor component, wherein each of the second conductive pillars is a solid cylinder, and the first encapsulant encapsulates the second conductive pillars and exposes an upper surface of each of the second conductive pillars, such that the second conductive pillars are electrically connected to the first redistribution layer.

3. The chip package structure as claimed in claim 2, wherein the second semiconductor component comprises a chip, a molding material and a redistribution circuit, wherein the molding material encapsulates the chip, the redistribution circuit is disposed on the molding material and electrically connected to the chip and the second conductive pillars.

4. The chip package structure as claimed in claim 1, wherein the second semiconductor component comprises an interposer having a plurality of through pillars.

5. The chip package structure as claimed in claim 1, wherein the second semiconductor component comprises a chip, a molding material, a plurality of through pillars and a redistribution circuit, wherein the molding material encapsulates the chip, the redistribution circuit is disposed between the first active surface and the molding material and electrically connected to the chip, and the through pillars penetrating the molding material to electrically connect the first redistribution layer and the redistribution circuit.

6. The chip package structure as claimed in claim 1, wherein the second semiconductor component comprises a chip, a molding material and a redistribution circuit, wherein the molding material encapsulates the chip, the redistribution circuit is disposed between the first active surface and the molding material and electrically connected to the chip and the first semiconductor component.

7. The chip package structure as claimed in claim 6, further comprising:
   a plurality of second conductive pillars connecting between the first active surface and the redistribution circuit, wherein each of the second conductive pillars is a solid cylinder, and the first encapsulant encapsulates the second conductive pillars.

8. The chip package structure as claimed in claim 1, further comprising a plurality of solder balls disposed on and electrically connected to the first redistribution layer.

9. The chip package structure as claimed in claim 2, further comprising:
   a third semiconductor component disposed on the first redistribution layer;
   a plurality of third conductive pillars disposed on and electrically connected to the third semiconductor component, wherein each of the third conductive pillars is a solid cylinder;
   a plurality of through pillars disposed on the first redistribution layer, wherein each of the through pillars is a solid cylinder; and
   a second encapsulant encapsulating the third semiconductor component, the third conductive pillars and the through pillars, wherein the second encapsulant exposes an upper surface of each of the third conductive pillars and an upper surface of each of the through pillars.

10. The chip package structure as claimed in claim 9, further comprising:
    a fourth semiconductor component disposed on the third semiconductor component;
    a plurality of fourth conductive pillars disposed on and electrically connected to the fourth semiconductor component, wherein each of the fourth conductive pillars is a solid cylinder, wherein the second encapsulant encapsulates the fourth semiconductor component and the fourth conductive pillars and exposes an upper surface of each of the fourth conductive pillars.

11. The chip package structure as claimed in claim 10, further comprising:
    a second redistribution layer disposed on the second encapsulant and electrically connected to the third conductive pillars, the through pillars and the fourth conductive pillars.

12. The chip package structure as claimed in claim 11, further comprising a plurality of solder balls disposed on and electrically connected to the second redistribution layer.

13. The chip package structure as claimed in claim 1, further comprising a plurality of first solder balls disposed on and electrically connected to the first redistribution layer.

14. The chip package structure as claimed in claim 13, further comprising:
    a sub chip package disposed on and electrically connected to the first solder balls, comprising:
       a second semiconductor component comprising a second active surface and a plurality of second pads disposed on the second active surface;

a plurality of second conductive pillars disposed on the second pads, wherein each of the second conductive pillars is a solid cylinder;

a second encapsulant encapsulating the second semiconductor component and the second conductive pillars, wherein the second encapsulant exposes an upper surface of each of the second conductive pillars;

a plurality of through pillars disposed around the second semiconductor component and penetrating the second encapsulant;

a second redistribution layer disposed on the second encapsulant and electrically connected to the second conductive pillars and the through pillars; and a plurality of second solder balls disposed on the second redistribution layer.

* * * * *